United States Patent
Suzuki et al.

(10) Patent No.: US 9,929,530 B2
(45) Date of Patent: Mar. 27, 2018

(54) OPTICAL SEMICONDUCTOR DEVICE

(71) Applicant: Mitsubishi Electric Corporation, Tokyo (JP)

(72) Inventors: Yosuke Suzuki, Tokyo (JP); Yuichiro Okunuki, Tokyo (JP); Go Sakaino, Tokyo (JP); Naoki Nakamura, Tokyo (JP); Ryoko Suzuki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/249,691

(22) Filed: Aug. 29, 2016

(65) Prior Publication Data

US 2017/0214215 A1    Jul. 27, 2017

(30) Foreign Application Priority Data

Jan. 25, 2016   (JP) .................................. 2016-011648

(51) Int. Cl.
| | |
|---|---|
| *H01S 5/022* | (2006.01) |
| *H01S 5/323* | (2006.01) |
| *H01S 5/16* | (2006.01) |
| *H01S 5/32* | (2006.01) |
| H01S 5/0683 | (2006.01) |
| H01S 5/227 | (2006.01) |
| H01S 5/22 | (2006.01) |

(52) U.S. Cl.
CPC ...... *H01S 5/02236* (2013.01); *H01S 5/02252* (2013.01); *H01S 5/02276* (2013.01); *H01S 5/164* (2013.01); *H01S 5/3213* (2013.01); *H01S 5/32316* (2013.01); *H01L 2224/48091* (2013.01); *H01S 5/02212* (2013.01); *H01S 5/0683* (2013.01); *H01S 5/2224* (2013.01); *H01S 5/2275* (2013.01); *H01S 5/3235* (2013.01); *H01S 2301/18* (2013.01)

(58) Field of Classification Search
CPC ........................ H01S 5/02236; H01S 5/32316
See application file for complete search history.

(56) References Cited

U.S. PATENT DOCUMENTS 5,016,253 A * 5/1991 Kubota .................. G02B 6/124
                                                    257/E33.076

FOREIGN PATENT DOCUMENTS

| JP | Sho59-193080 A | 11/1984 |
|---|---|---|
| JP | 2001-068777 A | 3/2001 |
| WO | 03/063309 A2 | 7/2003 |

* cited by examiner

*Primary Examiner* — Dung Nguyen
(74) *Attorney, Agent, or Firm* — Studebaker & Brackett PC

(57) ABSTRACT

An optical semiconductor device has a semiconductor laser which emits front-end-surface-side emergent light on the front end surface side and emits rear-end-surface-side emergent light on the rear end surface side, and a mount substrate having the semiconductor laser provided on its front surface. The rear-end-surface-side emergent light is emitted while having an emergence optical axis that extends away from the mount substrate with increase in distance from the rear end surface.

22 Claims, 13 Drawing Sheets

OPTICAL SEMICONDUCTOR DEVICE

BACKGROUND OF THE INVENTION

Field

The present invention relates to an optical semiconductor device and, more particularly, to an optical semiconductor device incorporating a semiconductor laser and suitable for use at a radiofrequency.

Background

JP 59-193080 A discloses an optical semiconductor device that receives emergent light from a rear end surface of a semiconductor laser by a photodiode.

In the optical semiconductor device, the semiconductor laser is mounted on a front surface of a mount substrate. For example, in a case where a wiring pattern for connection between the semiconductor laser and lead pins is provided on the mount substrate, there is a need to increase the surface area of the mount substrate. Since the emergent light has an angular divergence, the emergent light can easily strike the mount substrate if the mount substrate is increased in size.

SUMMARY

The present invention has been achieved to solve the above-described problem, and an object of the present invention is to provide an optical semiconductor device having such a structure that rear-end-surface-side emergent light does not easily strike the mount substrate.

The features and advantages of the present invention may be summarized as follows.

According to the present invention, an optical semiconductor device includes a semiconductor laser which emits front-end-surface-side emergent light on a front end surface side and emits rear-end-surface-side emergent light on a rear end surface side and a mount substrate having the semiconductor laser provided on its front surface, wherein the rear-end-surface-side emergent light is emitted while having an emergence optical axis that extends away from the mount substrate with increase in distance from the rear end surface.

Other and further objects, features and advantages of the invention will appear more fully from the following description.

DESCRIPTION OF EMBODIMENTS

Figure 1:
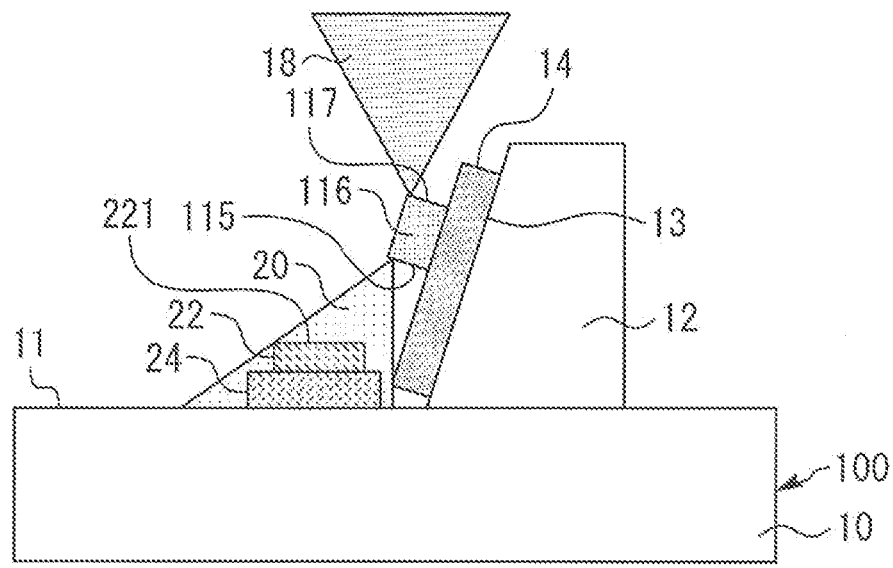
FIG. 1 is a sectional view of an optical semiconductor device in a first embodiment of the present invention.

An optical semiconductor device according to an embodiment of the present invention will be described with reference to the accompanying drawings. Components identical or corresponding to each other are indicated by the same reference characters, and repeated description of them is avoided in some cases.

First Embodiment

FIG. 1 is a sectional view of an optical semiconductor device 100 in a first embodiment of the present invention. A body part 10 has a reference surface 11 in its front surface. A block part 12 is disposed on the reference surface 11. The block part 12 has a first side surface 13. The first side surface 13 is inclined toward a side surface of the block part 12 opposite from the first side surface 13. A mount substrate 14 is disposed on the block part 12, with its rear surface being in contact with the first side surface 13. A front surface of the mount substrate 14 is parallel to the first side surface 13. The mount substrate 14 is a ceramic substrate. A semiconductor laser 116 is disposed on the front surface of the mount substrate 14. The semiconductor laser 116 emits front-end-surface-side emergent light 18 from a front end surface 117. The semiconductor laser 116 also emits rear-end-surface-side emergent light 20 from a rear end surface 115.

The rear-end-surface-side emergent light 20 is emitted while having an emergence optical axis that extends away from the mount substrate 14 with increase in distance from the rear end surface 115. The front-end-surface-side emergent light 18 is emitted while having an emergence optical axis that extends away from the mount substrate 14 with increase in distance from the front end surface 117. The first side surface 13 is inclined so that the front-end-surface-side emergent light 18 is directed perpendicularly to the reference surface 11. The front-end-surface-side emergent light 18 is thereby made incident on a center of a lens (not shown) provided in the optical semiconductor device 100, thus enabling obtaining a high optical output.

The optical semiconductor device 100 includes a photodiode 22 provided at such a position as to be able to receive the rear-end-surface-side emergent light 20. The photodiode 22 has a light receiving surface 221 on the emergence optical axis of the rear-end-surface-side emergent light 20. The rear-end-surface-side emergent light 20 is emitted in a certain proportion to the front-end-surface-side emergent light 18. The output from the semiconductor laser 116 can be monitored by receiving the rear-end-surface-side emergent light 20 through the photodiode 22.

The photodiode 22 is disposed on the surface of the ceramic substrate 24 provided on the reference surface 11. A construction may be adopted in which a sunk shape with a slant surface is provided in the reference surface 11, and in which the ceramic substrate 24 is disposed on the slant surface. The direction in which the rear-end-surface-side emergent light 20 is reflected by the photodiode 22 can be adjusted by means of the gradient of the slant surface. Signal noise due to incident of reflected light on the semiconductor laser 116 can be suppressed by this adjustment.

Figure 2:
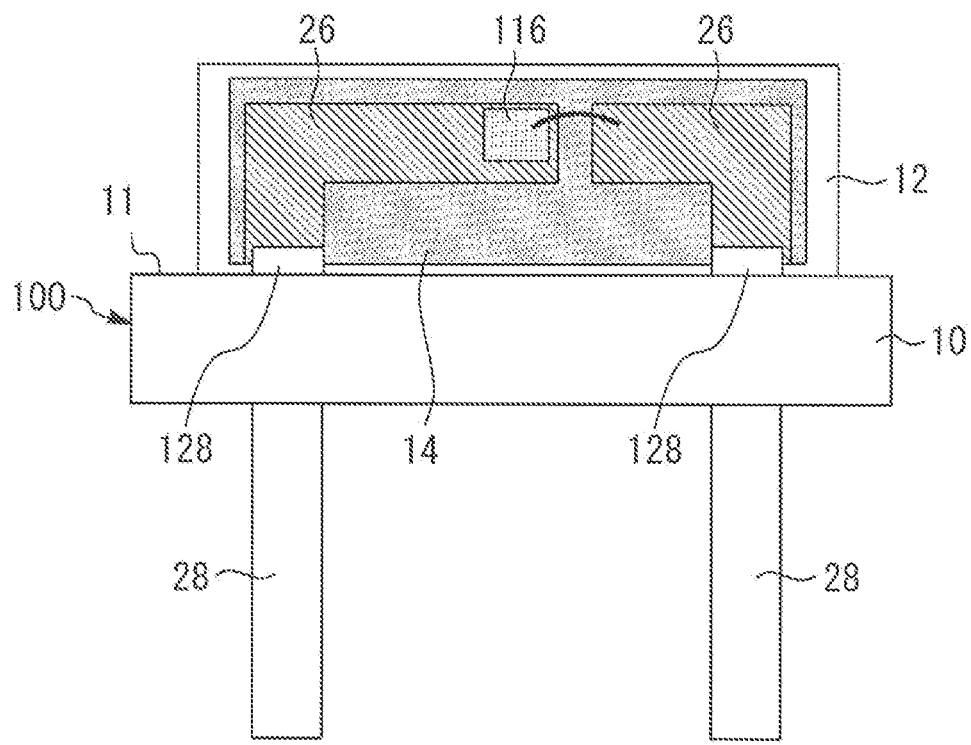
FIG. 2 is a front view of the optical semiconductor device in the first embodiment of the present invention.

FIG. 2 is a front view of the optical semiconductor device 100 in the first embodiment. The optical semiconductor device 100 has lead pins 28. The lead pins 28 are fixed on the body part 10, pass perpendicularly through the reference surface 11, and have end portions 128 projecting from the reference surface 11. Members made of an alloy having iron or copper as a principal material and plated with Au are used as the body part 10, block part 12 and lead pins 28.

The mount substrate 14 is provided with pattern wiring 26. The end portions 128 of the lead pins 28 are in contact with the pattern wiring 26. The pattern wiring 26 connects the lead pins 28 and the semiconductor laser 116 to each other. The pattern wiring 26 is a radiofrequency circuit using Au. The pattern wiring 26 is designed to inhibit reflection of an electrical signal in a frequency band according to the drive frequency of the semiconductor laser 116.

Figure 3:
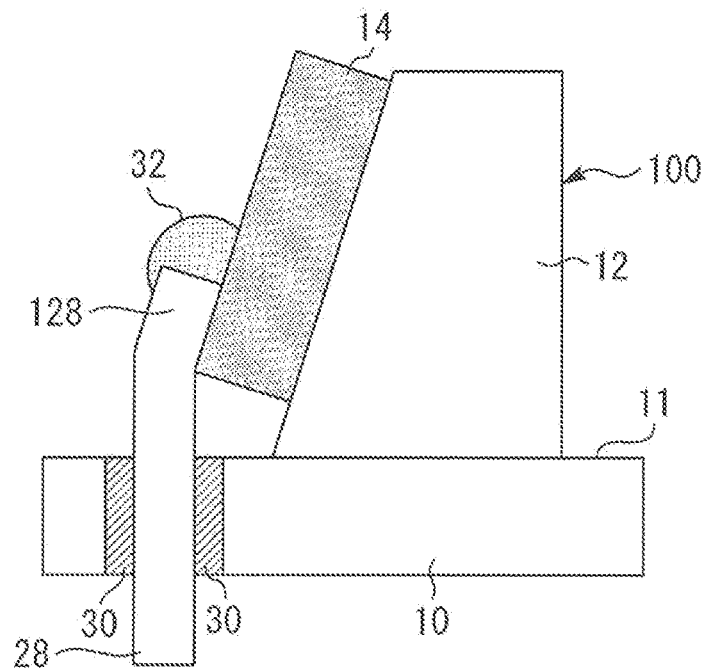
FIG. 3 is a sectional view of a lead pin portion of the optical semiconductor device in the first embodiment of the present invention.

FIG. 3 is a sectional view of a lead pin 28 portion of the optical semiconductor device 100 in the first embodiment. The lead pin 28 is fixed to the body part 10 by sealing glass 30. A material in a certain shape capable of maintaining airtightness and achieving impedance matching to a radiofrequency signal is used as the sealing glass 30. The body part 10, the block part 12, the lead pins 28 and the sealing glass 30 constitute a transistor outline (TO) header. The structure, material and dielectric constant of the TO header are selected according to the desired heat dissipation and radio frequency characteristics.

As shown in FIG. 3, the lead pin 28 has a bent structure such that an end portion 128 has surface contact with the front surface of the mount substrate 14. The lead pin 28 and the mount substrate 14 are joined to each other by using solder 32. In the present embodiment, the mount substrate 14 is inclined from a direction perpendicular to the reference surface 11. If in this structure a non-bendable straight lead pin is used, the lead pin and the pattern wiring 26 have line contact with each other. Therefore the contact area is reduced and there is a possibility of increase of reflection due to impedance mismatching as well as a possibility of insulation or increase in resistance to a high resistance value in the place of contact. In the present embodiment, the pattern wiring 26 provided on the mount substrate 14 and the lead pins 28 have surface contact with each other. The contact area is therefore increased in comparison with that in the case of the line contact, thus enabling inhibition of reflection of a radiofrequency signal in the place of contact as well as stabilization of the electrical connection and reduction of the resistance of the electrical connection.

Figure 4:
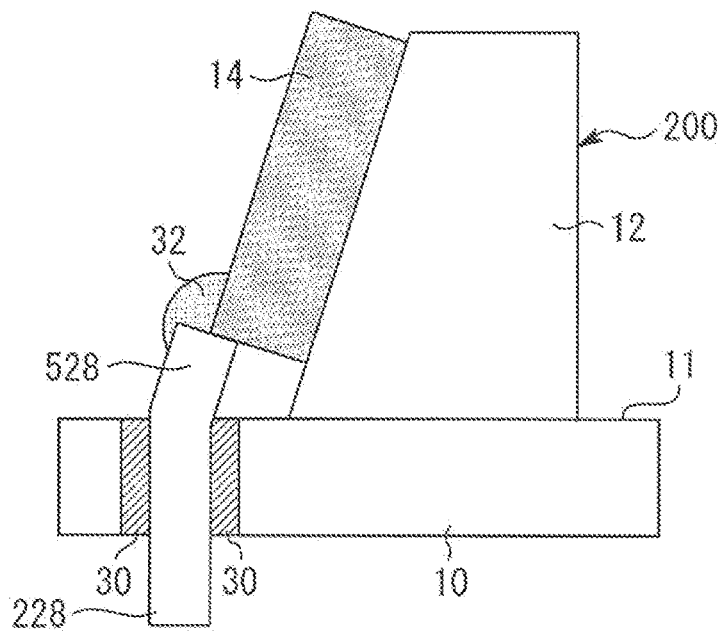
FIG. 4 is a sectional view of a modified example (1) of the first embodiment of the present invention.

FIG. 4 is a sectional view showing a modified example (1) of the present embodiment. In this modified example, an optical semiconductor device 200 has a lead pin 228. The lead pin 228 has a structure in which an end portion 528 is bent so that an upper surface of the end portion 528 has surface contact with a side surface of the mount substrate 14 opposed to the reference surface 11. Also in the present modified example, an effect can be obtained as a result of increasing the contact area between the pattern wiring 26 and the lead pin 228.

Figure 5:
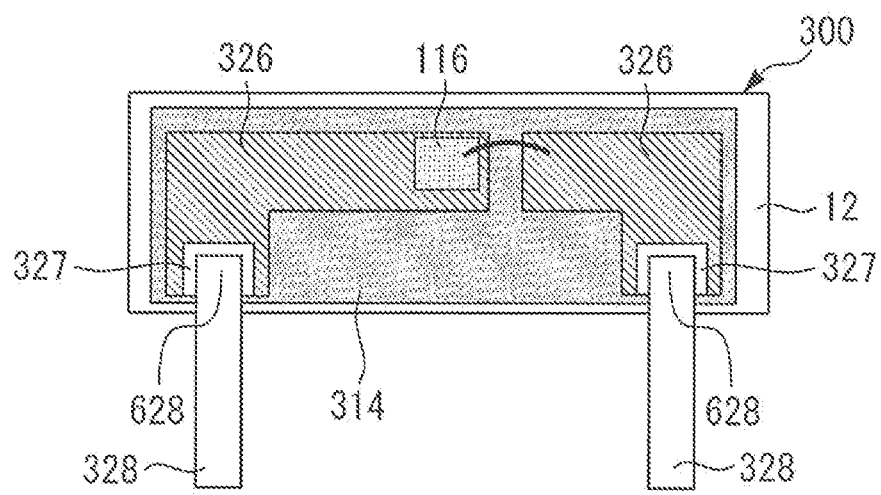
FIG. 5 is a front view of a modified example (2) of the first embodiment of the present invention.

FIG. 5 is a front view of a modified example (2) of the present embodiment. In this modified example, an optical semiconductor device 300 has a mount substrate 314 and a wiring pattern 326. For ease of illustration, the body part 10 is not shown in FIG. 5. The mount substrate 314 and the wiring pattern 326 have a cut 327. The cut 327 is hollowed in conformity to an end portion 628 of a lead pin 328 projecting from the reference surface 11. The end portion 628 is disposed in the cut 327.

Figure 6:
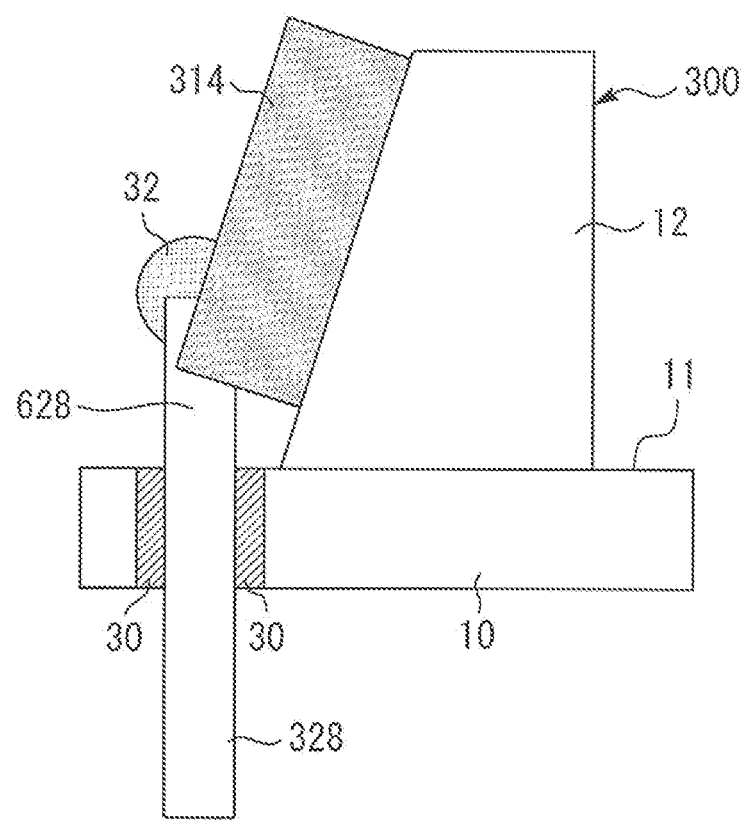
FIG. 6 is a sectional view of the modified example (2) of the first embodiment of the present invention.

FIG. 6 is a sectional view of the modified example (2) shown in FIG. 5. In this modified example, the end portion 628 is disposed so as to be fitted in the cut 327. Therefore the area of contact between the lead pin 328 and the wiring pattern 326 is increased in comparison with the case where the cut 327 is not provided. The effect as a result of increasing the contact area can also be obtained in the present modified example. Also, the mount substrate 314 can be mounted in conformity to the lead pins 328, so that the productivity at the time of assembly is improved.

Figure 7:
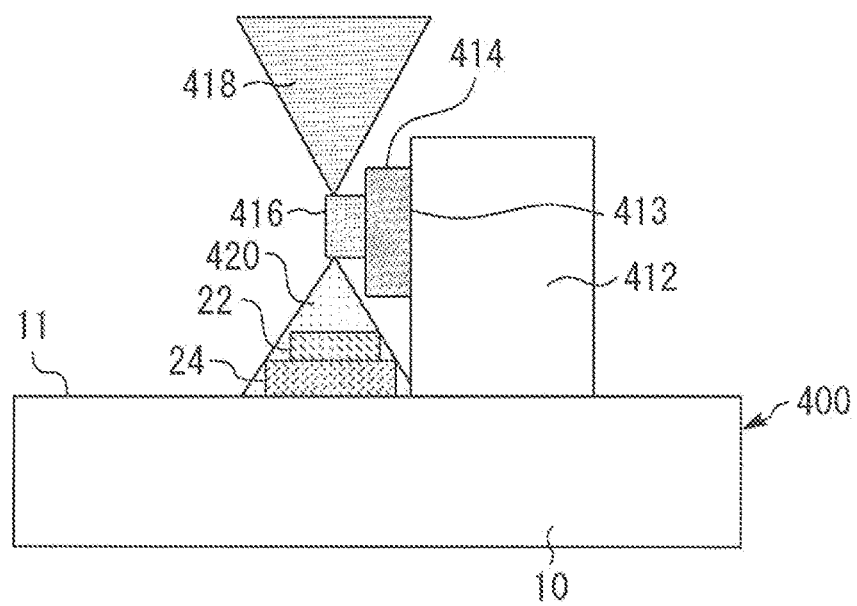
FIG. 7 is a sectional view of an optical semiconductor device in a comparative example.

FIG. 7 is a sectional view of an optical semiconductor device 400 according to a comparative example. The optical semiconductor device 400 has a block part 412 on the reference surface 11. The block part 412 has a first side surface 413 perpendicular to the reference surface 11. A mount substrate 414 whose front surface is perpendicular to the reference surface 11 is disposed on the first side surface 413. A semiconductor laser 416 is disposed on the front surface of the mount substrate 414. Front-end-surface-side emergent light 418 and rear-end-surface-side emergent light 420 from the semiconductor laser 416 have emergence optical axes perpendicular to the reference surface 11.

Figure 8:
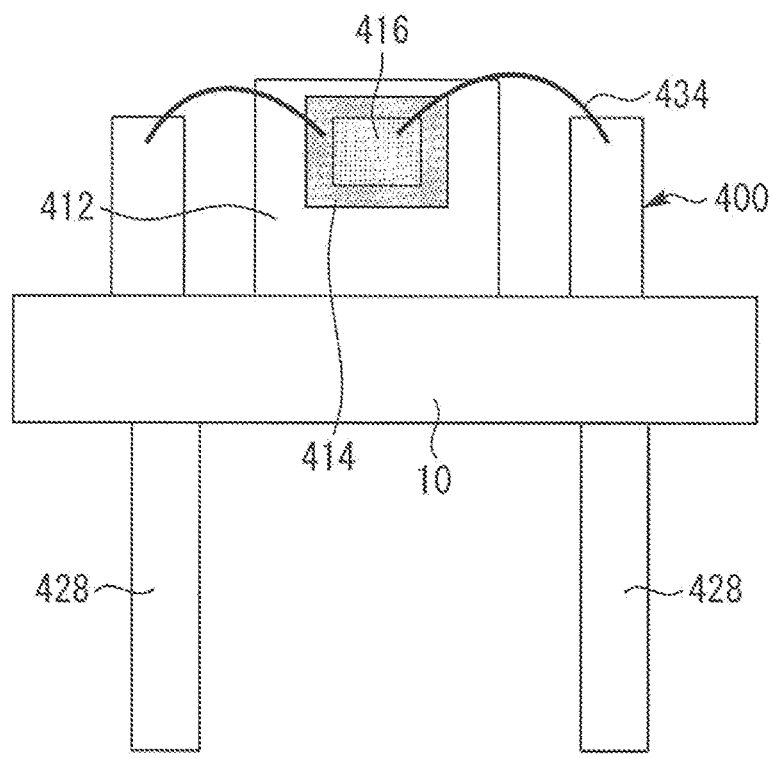
FIG. 8 is a front view of the optical semiconductor device in the comparative example.

FIG. 8 is a front view of the optical semiconductor device 400 according to the comparative example. Lead pins 428 are fixed in the block part 12. The lead pins 428 and the semiconductor laser 416 are electrically connected to each other by wires 434. In a case where wires are used for electrical connections in a radiofrequency band, the difficulty in achieving impedance matching is increased if the frequency at which the semiconductor laser is driven is increased. A construction, such as that described above with respect to the optical semiconductor device 100, may therefore be considered in which an impedance-matched wiring pattern is formed on a mount substrate, and in which the wiring pattern and lead pins are directly connected to each other. In a case where a wiring pattern is provided on a mount substrate, there is a need to increase the surface area of the mount substrate in comparison with the case where connections are made by wires.

Emergent light from the semiconductor laser 416 has an angular divergence. Therefore, if the surface area of the mount substrate 414 is increased, part of the emergent light can strike the mount substrate 414 more easily. If part of the emergent light strikes the mount substrate 414, the optical output may be reduced. Also, the emergent light reflected by the mount substrate 414 may become stray light to cause reductions in controllability and quality of the semiconductor laser 416.

In the optical semiconductor device 400, the photodiode 22 is disposed right below the semiconductor laser 416 on the emergence optical axis in order to receive the rear-end-surface-side emergent light 420 with efficiency. Therefore, if the mount substrate 414 is increased in size, it contacts the photodiode 22. In a case where the mount substrate 414 is increased in size, therefore, the photodiode 22 cannot be mounted on the emergence optical axis of the rear-end-surface-side emergent light 420. In such a case, the optical output received by the photodiode 22 is reduced and the influence of noise is increased. There is, therefore, a possibility of a reduction in accuracy of monitoring and a reduction in controllability of the optical output.

On the other hand, in the present embodiment, the rear-end-surface-side emergent light 20 is emitted while having an emergence optical axis that extends away from the mount substrate 14 with increase in distance from the rear end surface 115. Also, the front-end-surface-side emergent light 18 is emitted while having an emergence optical axis that extends away from the mount substrate 14 with increase in distance from the front end surface 117. Therefore, each of the rear-end-surface-side emergent light 20 and the front-end-surface-side emergent light 18 does not easily strike the mount substrate 14 even in a case where the mount substrate 14 is increased in size. Thus, the reduction in optical output and the generation of stray light due to reflection can be inhibited even in a case where the mount substrate 14 is increased in size.

The emergence optical axis of the rear-end-surface-side emergent light 20 extends away from the mount substrate 14 with increase in distance from the rear end surface 115. The photodiode 22 can therefore receive the rear-end-surface-side emergent light 20 on the emergence optical axis at a position remote from the position right below the mount substrate. Thus, increasing the mount substrate 14 in size and securing the accuracy of monitoring with the photodiode 22 are compatible with each other.

Further, in the present embodiment, the first side surface 13 is inclined. The surface area of the first side surface 13 is thereby increased in comparison with the case where the first side surface is perpendicular to the reference surface 11. A sufficiently larger size of the mount substrate 14 can therefore be secured in comparison with the case where the first side surface 13 is perpendicular to the reference surface 11. Also, the height of the optical semiconductor device 100 can be reduced since the first side surface 13 is inclined.

Figure 9:
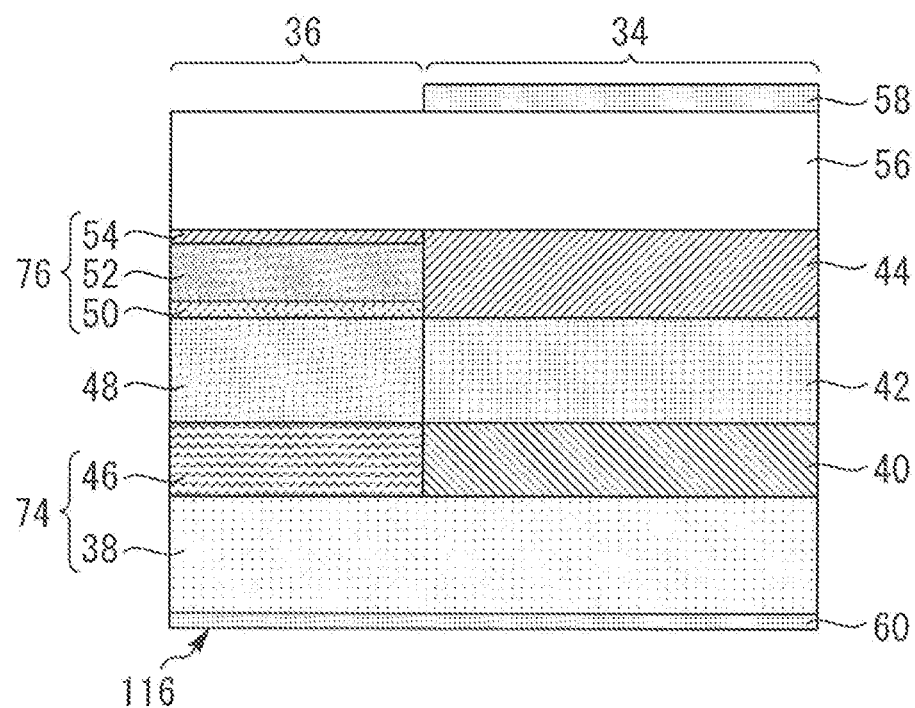
FIG. 9 is a sectional view in the resonance direction of the semiconductor laser in the first embodiment of the present invention.

The structure of the semiconductor laser 116 will subsequently be described. FIG. 9 is a sectional view of the semiconductor laser 116 in the first embodiment. A semiconductor substrate 38 is disposed on a surface of an N-type electrode 60. The semiconductor substrate 38 is formed of N-type InP and has a refractive index of 3.207. A first cladding layer 40 is disposed on a surface of the semiconductor substrate 38. The first cladding layer 40 is formed of N-type InP. An active layer 42 is disposed on a surface of the first cladding layer 40. The active layer 42 is a layer of an AlGaInAs compound having a refractive index larger than that of InP. In the present embodiment, the active layer 42 has a refractive index of 3.415 and a layer thickness of 220 nm. A second cladding layer 44 is disposed on a surface of the active layer 42. The second cladding layer 44 is formed of P-type InP. The above-described members constitute a laser part 34.

A non-doped InP layer 46 is disposed adjacent to the laser part 34 on the surface of the semiconductor substrate 38. The upper end of the InP layer 46 is set level with the lower end of the active layer 42. The InP layer 46 has a refractive index of 3.207. A core layer 48 is disposed on a surface of the InP layer 46. The core layer 48 is formed of InGaAsP compound having such a composition that its refractive index is 3392, and has a layer thickness of 220 nm. The refractive index of the core layer 48 is set equal to or smaller than that of the active layer 42.

A first semiconductor layer 50 is disposed on a surface of the core layer 48. The first semiconductor layer 50 is formed of non-doped InP. The first semiconductor layer 50 has a refractive index of 3.207 and a layer thickness of 100 nm. A first light distribution modification layer 52 is disposed on a surface of the first semiconductor layer 50. The first light distribution modification layer 52 is formed of InGaAsP compound having such a composition that its refractive index is 3.495, and has a layer thickness of 200 nm. The refractive index of the first semiconductor layer 50 is set smaller than those of the core layer 48 and the first light distribution modification layer 52. A third cladding layer 54 is disposed on a surface of the first light distribution modification layer 52. The third cladding layer 54 is formed of P-type InP and has a layer thickness of 570 nm. The above-described members constitute an optical waveguide part 36.

The laser part 34 and the optical waveguide part 36 are adjusted so that their surfaces are level with each other. A contact layer 56 is disposed on surfaces of the laser part 34 and the optical waveguide part 36. A P-type electrode 58 is disposed on a surface of the contact layer 56 above the laser part 34. The semiconductor laser 116, having the optical waveguide part 36 on the rear end surface 115 side in opposite sides of the laser part 34 as shown in FIG. 9, also has an optical waveguide part (not shown) on the front end surface 117 side.

The first semiconductor layer 50, the first light distribution modification layer 52 and the third cladding layer 54 positioned higher than the active layer 42 form an upper semiconductor layer 76. The semiconductor substrate 38 and the InP layer 46 positioned lower than the active layer 42 form a lower semiconductor layer 74. In the optical waveguide part 36, the refractive index of the upper semiconductor layer 76 is set larger than that of the lower semiconductor layer 74. Under this condition, emergent light is bent toward the upper semiconductor layer 76. In the present embodiment, the position of a center of a far-field pattern (FFP) of the emergent light deviates by 15.8 degrees toward the upper semiconductor layer 76. In the present embodiment, the deviation of the center position of the FFP means the angle of emergence of the emergent light. The angle of emergence is the angle formed between the emergence optical axis and the active layer 42.

The semiconductor laser 116 is mounted on the mount substrate 14 by having its N-type electrode 60 side in contact with the front surface of the mount substrate 14. The rear-end-surface-side emergent light 20 having an emergence optical axis extending away from the mount substrate 14 with increase in distance from the rear end surface 115 is realized thereby. The front-end-surface-side emergent light 18 having an emergence optical axis extending away from the mount substrate 14 with increase in distance from the front end surface 117 is also realized.

A modified example of the present embodiment is conceivable in which the refractive index of the upper semiconductor layer 76 is set smaller than that of the lower semiconductor layer 74. In this case, the FFP center position deviates toward the lower semiconductor layer 74. In the present embodiment, the semiconductor laser 116 is mounted by having its P-type electrode 58 side in contact with the front surface of the mount substrate 14. The rear-end-surface-side emergent light 20 having an emergence optical axis extending away from the mount substrate 14 with increase in distance from the rear end surface 115 is realized thereby. The front-end-surface-side emergent light 18 having an emergence optical axis extending away from the mount substrate 14 with increase in distance from the front end surface 117 is also realized.

Figure 10:
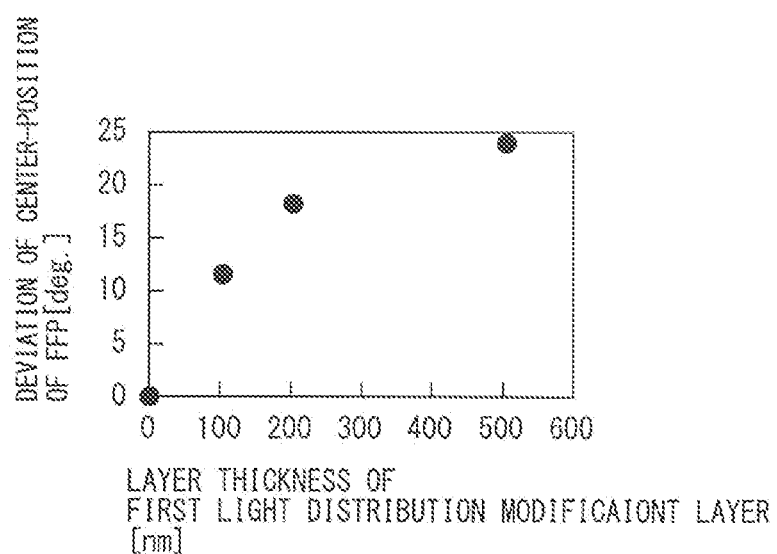
FIG. 10 is a graph (1) showing a deviation of a far field pattern in terms of angular change in the first embodiment of the present invention.

FIG. 10 shows a deviation of the FFP center position when the layer thickness of the first light distribution modification layer 52 is changed in the present embodiment, while the layer thickness of the third cladding layer 54 is adjusted so that the sum of the layer thickness of the first light distribution modification layer 52 and the layer thickness of the third cladding layer 54 is 590 nm. The refractive indices and layer thicknesses of the other layers are the same as those shown above. The deviation becomes larger with the increase in thickness of the first light distribution modification layer 52.

Figure 11:
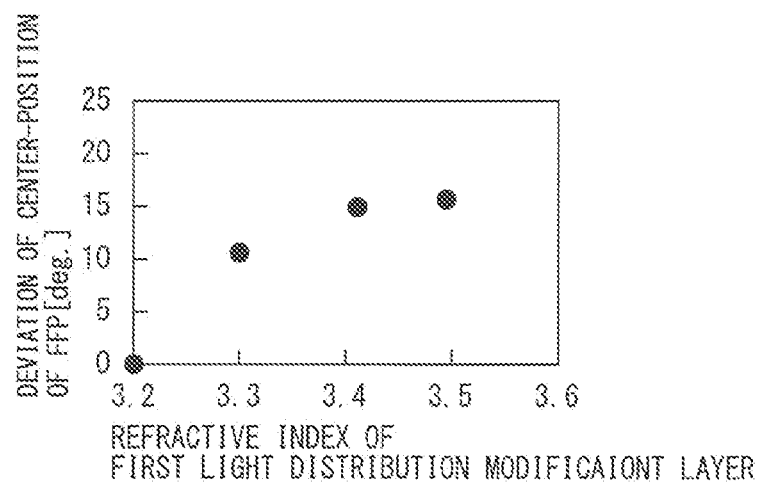
FIG. 11 is a graph (2) showing a deviation of a far field pattern in terms of angular change in the first embodiment of the present invention.

FIG. 11 shows a deviation of the FFP center position when the refractive index of the first light distribution modification layer 52 is changed in the present embodiment. The refractive indices and layer thicknesses of the layers are the same as those shown above. A deviation of the FFP center position occurs when the refractive index of the first light distribution modification layer 52 is larger than the refractive index 3.207 of the lower semiconductor layer 74. Also, the deviation becomes larger with the increase in thickness of the first light distribution modification layer 52.

Figure 12:
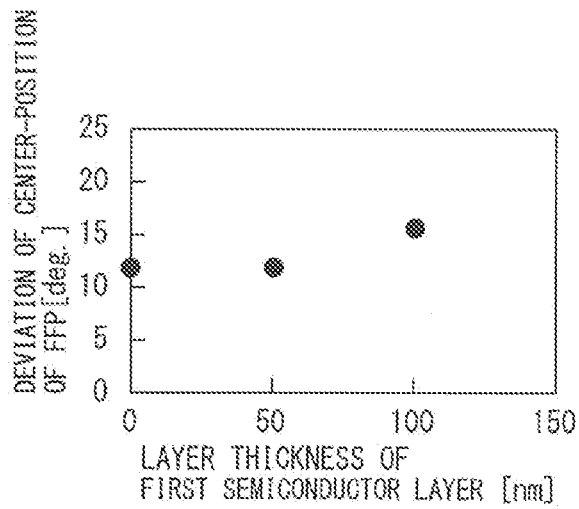
FIG. 12 is a graph (3) showing a deviation of a far field pattern in terms of angular change in the first embodiment of the present invention.

FIG. 12 shows a deviation of the FFP center position when the layer thickness of the first semiconductor layer 50 is changed in the present embodiment. The refractive indices and layer thicknesses of the layers are the same as those shown above. The deviation of the FFP center position becomes larger with the increase in thickness of the first semiconductor layer 50. A deviation of the FFP center position occurs even in a case where the first semiconductor layer 50 is not provided.

As can be understood from the above, the deviation of the FFP center position can be adjusted by adjusting the refractive indices or the layer thicknesses of the layers in the optical waveguide part 36. As a result, the desired emergence angle can be obtained. The core layer 48 and the first light distribution modification layer 52 may alternatively be formed of an AlGaInAs compound having a suitable refractive index. Also, on the basis of a free-carrier plasma effect, the refractive index can be reduced by increasing the carrier concentration. The desired refractive index can therefore be achieved by controlling the amount of an impurity dope.

The angle of emergence of front-end-surface-side emergent light 18 and the angle of emergence of rear-end-surface-side emergent light 20 may be different from each other. In such a case, the optical waveguide part on the front end surface 117 side and the optical waveguide part 36 on the rear end surface 115 side have different refractive index settings.

A method of manufacturing the semiconductor laser 116 in the present embodiment will subsequently be described. While the semiconductor laser 116 has the optical waveguide parts adjacent to opposite ends of the laser part 34, the method will be described with respect to a case where the optical waveguide part 36 is provided only on the rear end surface 115 side for ease of explanation. FIGS. 13 to 22 are diagrams for explaining the method of manufacturing the semiconductor laser 116 in the present embodiment. FIGS. 13 to 17 are sectional views along the resonance direction of the semiconductor laser 116, while FIGS. 18 to 22 are sectional views along a direction perpendicular to the resonance direction.

Figure 13:
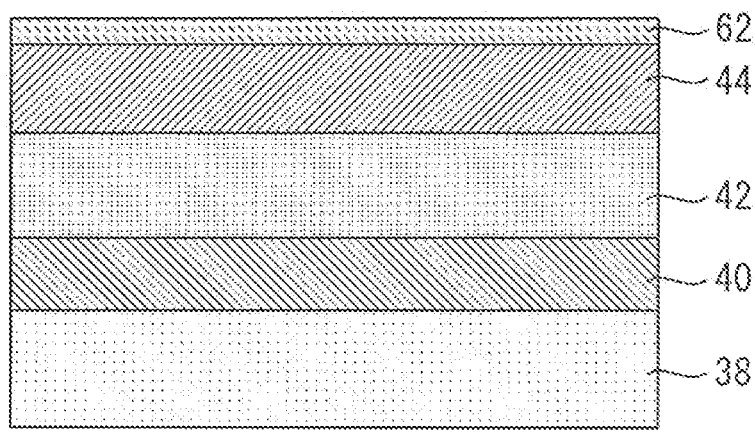
FIG. 13 is a sectional view in the resonance direction showing a state after forming an oxide film on a surface of a crystal growth layer in the first embodiment of the present invention.

First, as shown in FIG. 13, a crystal growth layer is formed on the surface of the semiconductor substrate 38 by metal organic chemical vapor deposition (MOCVD). In the crystal growth layer, the first cladding layer 40, the active layer 42 and the second cladding layer 44 are laid one on another. Next, oxide film 62 is formed on a surface of the crystal growth layer. The oxide film 62 is SiO$_2$ film.

Figure 14:
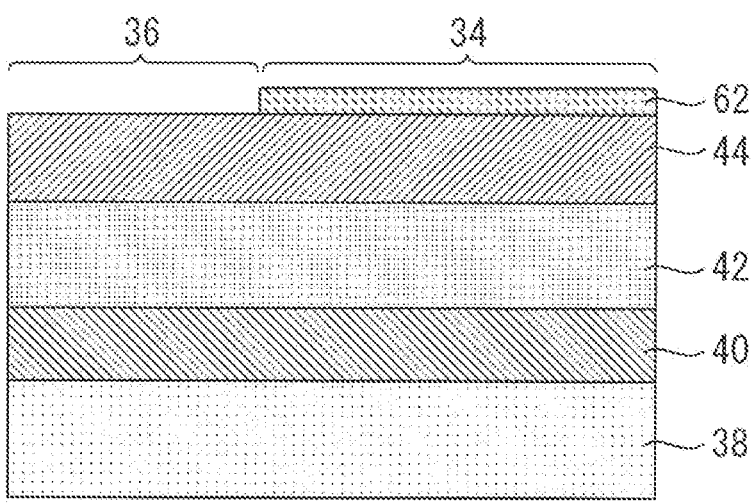
FIG. 14 is a sectional view in the resonance direction showing a state after patterning of the oxide film in the state shown in FIG. 13 in the first embodiment of the present invention.
Figure 15:
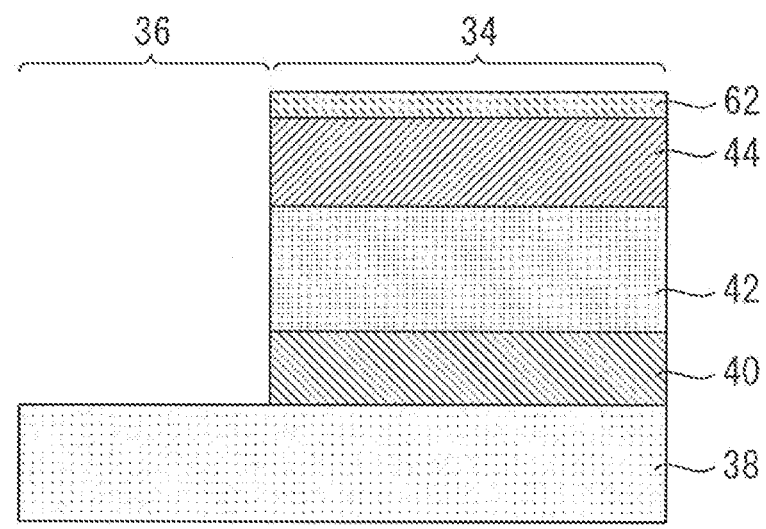
FIG. 15 is a sectional view in the resonance direction showing a state after etching from the state shown in FIG. 14 in the first embodiment of the present invention.

Subsequently, as shown in FIG. 14, the oxide film 62 is patterned, with its portion left for the laser part 34 to be formed afterward. Subsequently, as shown in FIG. 15, the crystal growth layer is removed by dry etching or wet etching using the oxide film 62 as a mask. The semiconductor substrate 38 is exposed thereby. Etching may be performed to expose the first cladding layer 40.

Figure 16:
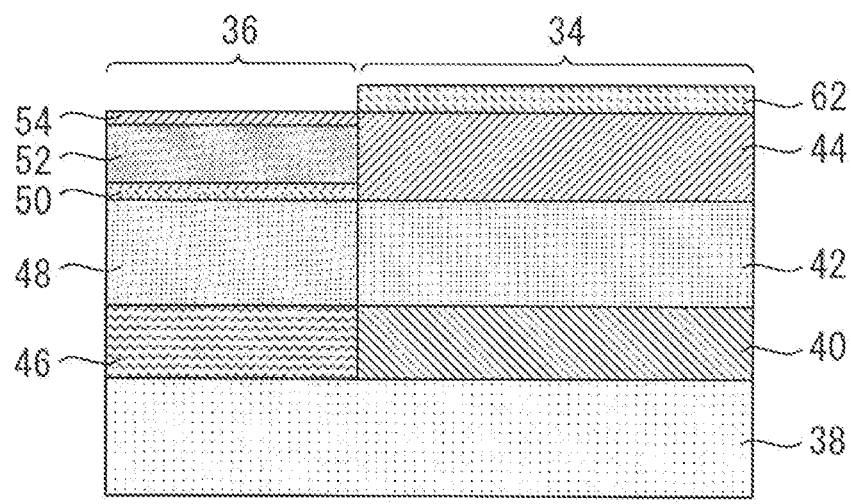
FIG. 16 is a sectional view in the resonance direction showing a state after forming an optical waveguide part in the state shown in FIG. 15 in the first embodiment of the present invention.
Figure 17:
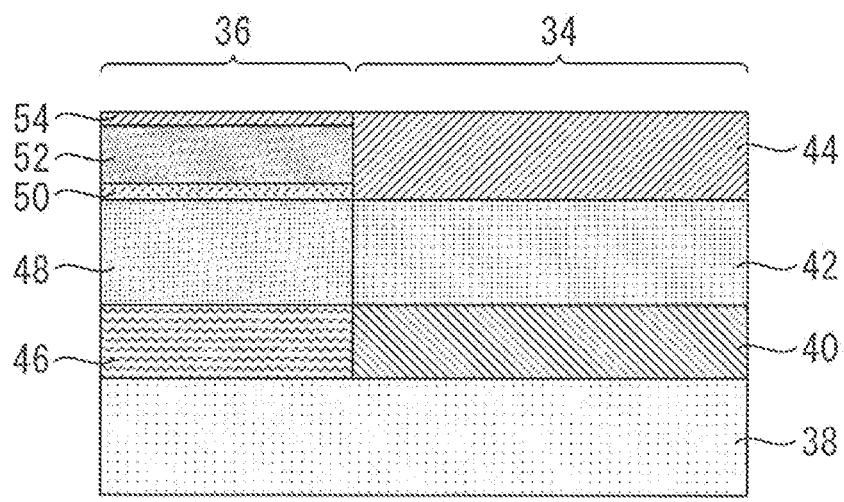
FIG. 17 is a sectional view in the resonance direction showing a state after removing the oxide film from the state shown in FIG. 16 in the first embodiment of the present invention.

Subsequently, as shown in FIG. 16, the non-doped InP layer 46 is formed on the surface of the semiconductor substrate 38 by MOCVD using the oxide film 62 as a mask. The InP layer 46 is formed to the same position as that of the lower end of the active layer 42. Further, the core layer 48, the first semiconductor layer 50, the first light distribution modification layer 52 and the third cladding layer 54 are formed by being laid one on another. Subsequently, as shown in FIG. 17, the oxide film 62 is removed by using hydrofluoric acid.

Figure 18:
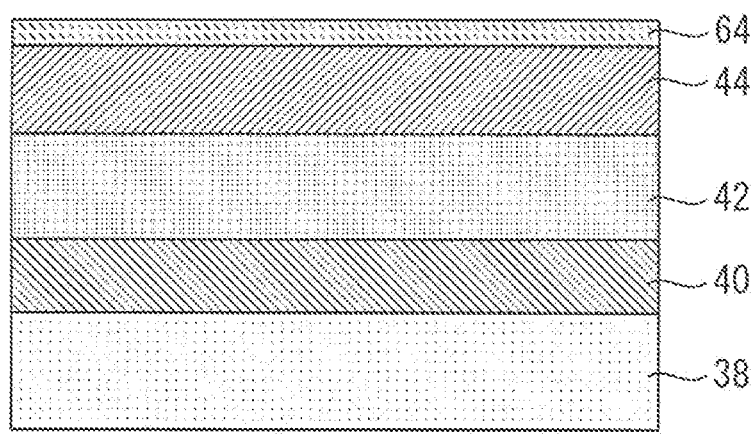
FIG. 18 is a vertical sectional view in the resonance direction showing a state after forming an oxide film in the state shown in FIG. 17 in the first embodiment of the present invention.
Figure 19:
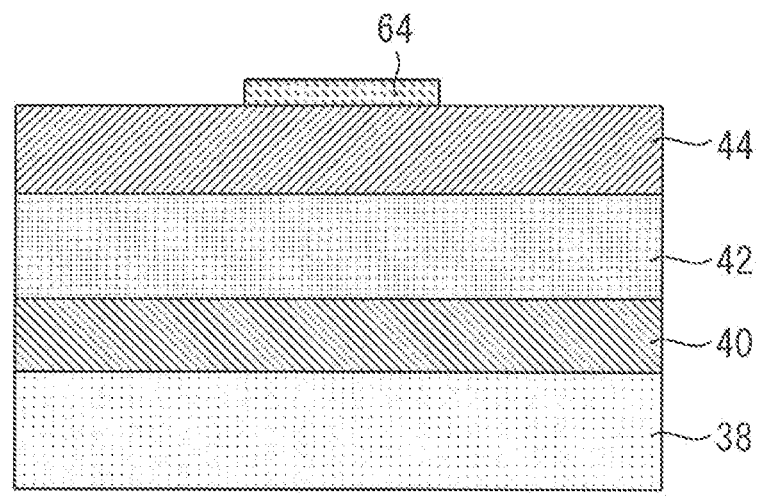
FIG. 19 is a vertical sectional view in the resonance direction showing a state after working the oxide film into a stripe form from the state shown in FIG. 18 in the first embodiment of the present invention.
Figure 20:
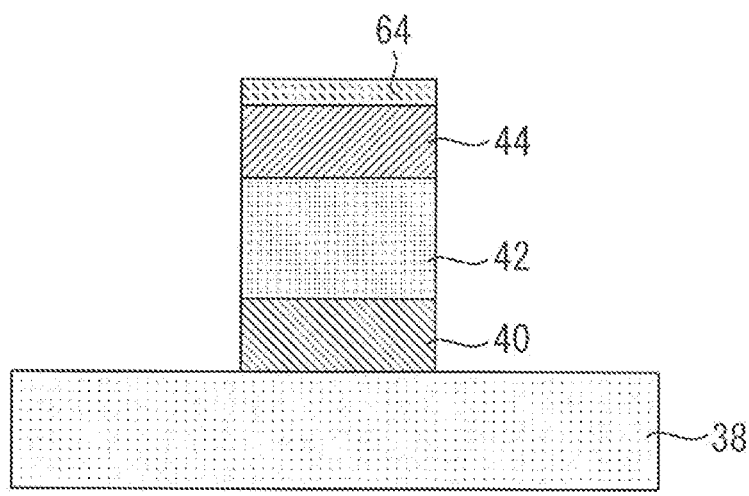
FIG. 20 is a vertical sectional view in the resonance direction showing a state after etching from the state shown in FIG. 19 in the first embodiment of the present invention.

FIG. 18 is a sectional view of the laser part 34 along a direction perpendicular to the resonance direction. After the process step shown in FIG. 17, oxide film 64 is formed on surfaces of the second cladding layer 44 and the third cladding layer 54. The oxide film 64 is SiO$_2$ film. Subsequently, as shown in FIG. 19, the oxide film 64 is worked into a stripe form having a width of 1 to 2 μm. Subsequently, as shown in FIG. 20, a ridge structure is formed by dry etching or wet etching using the oxide film 64 as a mask.

Figure 21:
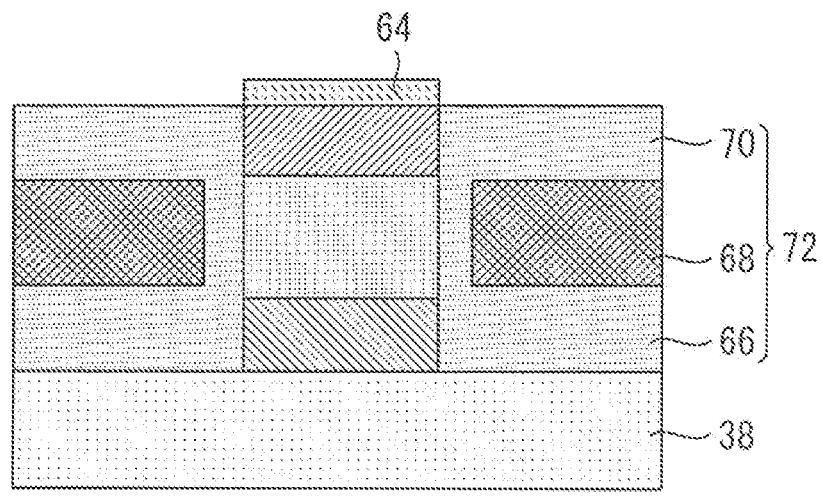
FIG. 21 is a vertical sectional view in the resonance direction showing a state after forming a current confinement structure in the state shown in FIG. 20 in the first embodiment of the present invention.

Subsequently, as shown in FIG. 21, a current confinement structure 72 is formed on a ridge side surface by MOCVD using the oxide film 64 as a mask. The current confinement structure 72 includes P—N—P-type InP structures 66, 68, and 70. The current confinement structure 72 uses InP doped with Fe, which is a semi-insulating semiconductor, to enable causing a current flow through the ridge portion while concentrating the current thereinto.

Figure 22:
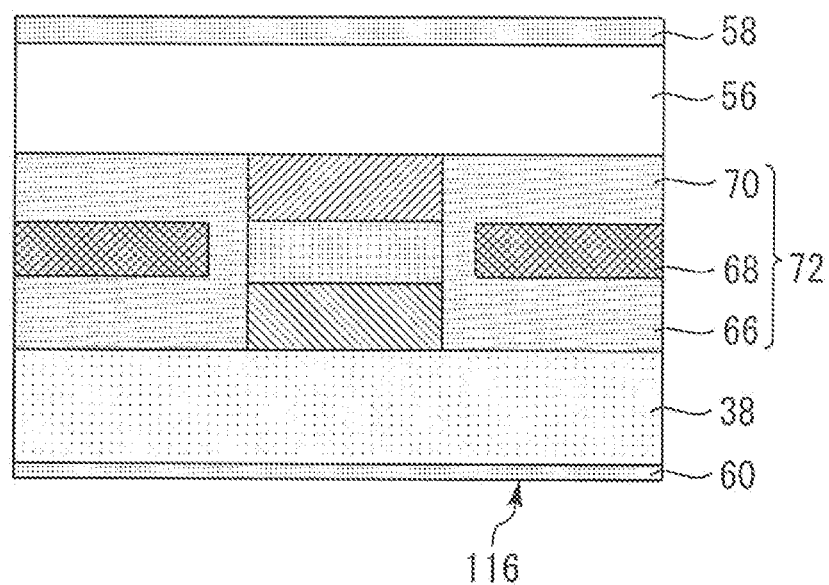
FIG. 22 is a vertical sectional view in the resonance direction showing a state after forming a contact layer and an electrode in the state shown in FIG. 21 in the first embodiment of the present invention.

Subsequently, as shown in FIG. 22, the oxide film 64 is removed by hydrofluoric acid. Subsequently, the contact layer 56 is laid on surfaces of the ridge portion and the current confinement structure 72 by MOCVD. Subsequently, the P-type electrode 58 is formed on the surface of the contact layer 56. Also, the N-type electrode 60 is formed on the back surface of the semiconductor substrate 38. It is desirable to avoid current injection into the optical waveguide part 36 not contributing to emission of light. Therefore, as shown in FIG. 9, the P-type electrode 58 is not formed on the optical waveguide part 36. The arrangement may be such that the N-type electrode 60 is not formed below the optical waveguide part 36. The semiconductor laser 116 is constructed through the above steps. A combination of reverse designations of N and P types to the layers may suffice for the semiconductor laser 116.

Figure 23:
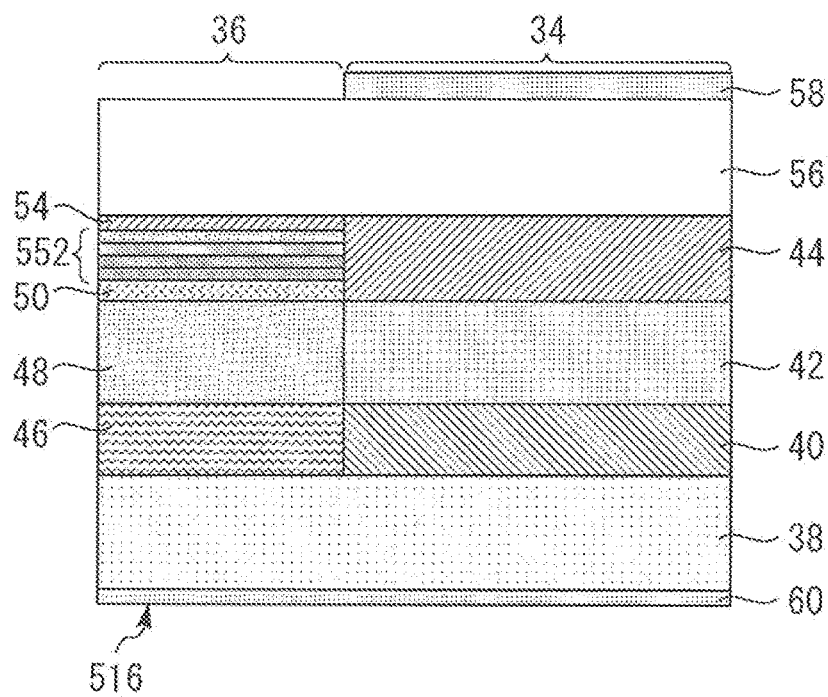
FIG. 23 is a sectional view in the resonance direction showing a modified example (1) of the semiconductor laser in the first embodiment of the present invention.

FIG. 23 is a sectional view along the resonance direction of a modified example (1) of the semiconductor laser 116 in the present embodiment. A semiconductor laser 516 in this modified example has a first light distribution modification layer 552. The first light distribution modification layer 552 includes semiconductor layers having refractive indices set stepwise in decreasing order in the direction of epitaxial crystal growth, thereby facilitating fine adjustment of the quantity of light oozing into the first light distribution modification layer 552. The controllability of the emergence angle can be improved thereby. The first light distribution modification layer 552 may be formed so that the refractive index decreases continuously in the epitaxial crystal growth direction. The first light distribution modification layer 552 may alternatively be formed so that the refractive index increases stepwise or continuously in the epitaxial crystal growth direction.

Figure 24:
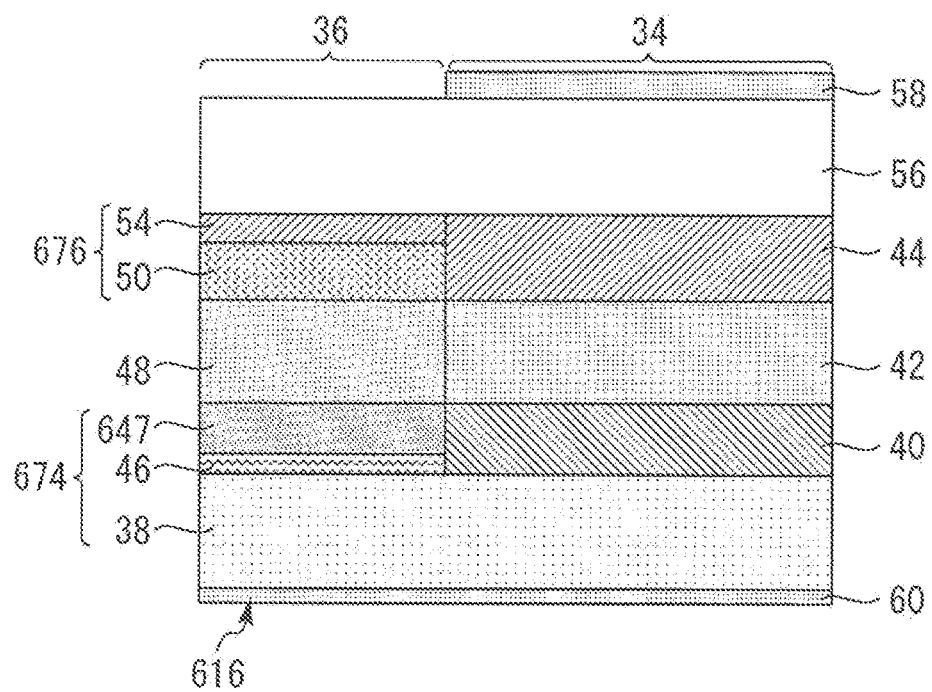
FIG. 24 is a sectional view in the resonance direction showing a modified example (2) of the semiconductor laser in the first embodiment of the present invention.

FIG. 24 is a sectional view along the resonance direction of a modified example (2) of the semiconductor laser 116 in the present embodiment. A semiconductor laser 616 in this modified example does not have the first light distribution modification layer 52 but has a second light distribution modification layer 647 between the InP layer 46 and the core layer 48. The second light distribution modification layer 647 is formed of an InGaAsP compound having a refractive index smaller than that of InP. In the semiconductor laser 616, the first semiconductor layer 50 and the third cladding layer 54 form an upper semiconductor layer 676. Also, the semiconductor substrate 38, the InP layer 46 and the second light distribution modification layer 647 positioned lower than the active layer 42 form a lower semiconductor layer 674.

By providing the second light distribution modification layer 647 having a smaller refractive index, the refractive index of the lower semiconductor layer 674 is made smaller than that of the upper semiconductor layer 676. As a result, the emergent light is bent toward the upper semiconductor layer 676. The semiconductor laser 616 may have both the first light distribution modification layer 52 and the second light distribution modification layer 647. Also, the second light distribution modification layer 647 may be formed so that the refractive index decreases or increases stepwise or continuously in the epitaxial crystal growth direction, as in the semiconductor laser 516.

Another modified example of the present embodiment is conceivable in which the optical waveguide part 36 is provided only on the front end surface 117 side of the semiconductor laser 116. In this modified example, the front-end-surface-side emergent light 18 is emitted while having an emergence optical axis that extends away from the mount substrate 14 with increase in distance from the front end surface 117. Therefore, the front-end-surface-side emergent light 18 does not easily strike the mount substrate 14 even in a case where the mount substrate 14 is increased in size. Since the optical waveguide part 36 is not provided on the rear end surface 115 side, the rear-end-surface-side emergent light 20 is emitted parallel to the active layer 42. The semiconductor laser 116 can be disposed closer to the reference surface 11 side on the front surface of the mount substrate 14 to ensure that the rear-end-surface-side emergent light 20 does not easily strike the mount substrate 14. Also, since the optical waveguide part 36 may be provided only on the front end surface 117 side, the semiconductor laser 116 can be constructed in a simple structure.

Second Embodiment

Figure 25:
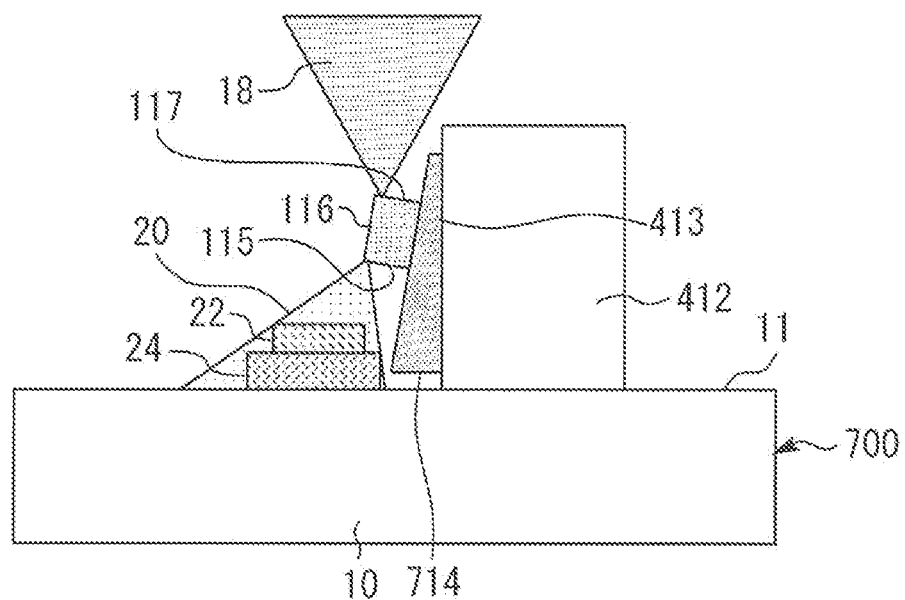
FIG. 25 is a sectional view of an optical semiconductor device in a second embodiment of the present invention.

FIG. 25 is a sectional view of an optical semiconductor device 700 in a second embodiment of the present invention. The optical semiconductor device 700 has the block part 412. The block part 412 has the first side surface 413 perpendicular to the reference surface 11. A mount substrate 714 is disposed on the block part 412, with its back surface being in contact with the first side surface 413. The semiconductor laser 116 is mounted on the front surface of the mount substrate 714. The front surface of the mount substrate 714 has an inclined structure such that the front-end-surface-side emergent light 18 is directed perpendicularly to the reference surface 11.

Also in the present embodiment, the rear-end-surface-side emergent light 20 is emitted while having an emergence optical axis that extends away from the mount substrate 714 with increase in distance from the rear end surface 115, as is that in the first embodiment. The front-end-surface-side emergent light 18 is also emitted while having an emergence optical axis that extends away from the mount substrate 714 with increase in distance from the front end surface 117. Therefore, the emergent light does not easily strike the mount substrate 714 even in case where the mount substrate 714 is increased in size. Since the front surface of the mount substrate 714 is inclined, a correspondingly increased surface area of the mount substrate 714 can be secured. Further, the thickness of the mount substrate 714 in a section intersecting the inclined front surface is reduced with increase in distance from the reference surface 11. The impedance of the mount substrate 714 can be continuously changed according to the thickness of the mount substrate 714, thus facilitating impedance matching.

Third Embodiment

Figure 26:
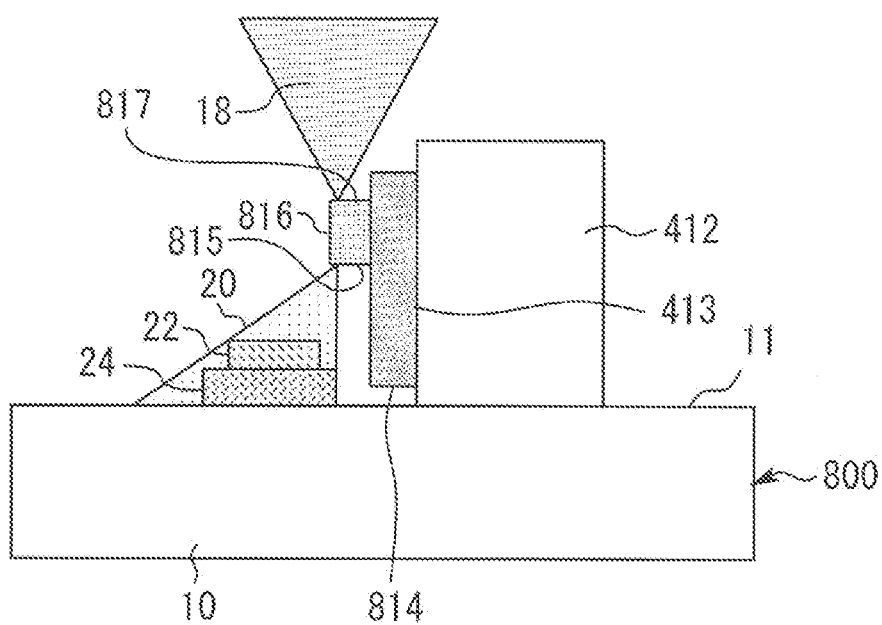
FIG. 26 is a sectional view of an optical semiconductor device in a third embodiment of the present invention.

FIG. 26 is a sectional view of an optical semiconductor device 800 in a third embodiment of the present invention. The optical semiconductor device 800 has the block part 412, as does the semiconductor device in the second embodiment. A mount substrate 814 is disposed on the block part 412, with its back surface being in contact with the first side surface 413. A semiconductor laser 816 is mounted on the front surface of the mount substrate 814. In the present embodiment, the first side surface 413 and the back and front surfaces of the mount substrate 814 are parallel to each other.

The semiconductor laser 816 has the optical waveguide part 36 only on the rear end surface 815 side. Through the optical waveguide part 36, the rear-end-surface-side emergent light 20 is emitted while having an emergence optical axis that extends away from the mount substrate 814 with increase in distance from the rear end surface 815. Therefore, the rear-end-surface-side emergent light 20 does not easily strike the mount substrate 814 even in a case where the mount substrate 814 is increased in size. Also, the emergent light can be received on the emergence optical axis even in a case where the photodiode 22 is disposed at a distance from the position right below the mount substrate 814. Thus, increasing the mount substrate 814 in size and securing the accuracy of monitoring with the photodiode 22 are compatible with each other.

Since the optical waveguide part 36 is not provided on the front end surface 817 side, the front-end-surface-side emergent light 18 is emitted parallel to the active layer 42. The semiconductor laser 816 can be disposed away from the reference surface 11 on the front surface of the mount substrate 814 to ensure that the front-end-surface-side emergent light 18 does not easily strike the mount substrate 814.

In the present embodiment, the optical waveguide part 36 may be provided only on the rear end surface 815 side. Also, there is no need to incline the first side surface 413 or the front surface of mount substrate 814. The optical semiconductor device 800 can therefore be constructed in a simple structure in comparison with the first and second embodiments.

In the optical semiconductor device according to the present invention, the emergence optical axis of the rear-end-surface-side emergent light extends away from the mount substrate with increase in distance from the rear end surface. Therefore, the rear-end-surface-side emergent light does not easily strike the mount substrate.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2016-011648, filed on Jan. 25, 2016 including specification, claims, drawings and summary, on which the Convention priority of the present application is based, are incorporated herein by reference in its entirety.

The invention claimed is:

1. An optical semiconductor device comprising:
   a semiconductor laser which emits front-end-surface-side emergent light on a front end surface side and emits rear-end-surface-side emergent light on a rear end surface side; and
   a mount substrate having the semiconductor laser provided on its front surface,
   wherein the rear-end-surface-side emergent light is emitted while having an emergence axis that extends from the rear end surface side in a direction away from the front surface of the mount substrate, and at a non-zero angle with respect to the front surface of the mount substrate.

2. The optical semiconductor device according to claim 1, further comprising a photodiode having a light receiving surface on the emergence optical axis of the rear-end-surface-side emergent light.

3. The optical semiconductor device according to claim 2, further comprising a body part having a reference surface, wherein the photodiode is disposed on the reference surface;
   the front-end-surface-side emergent light is emitted while having an emergence optical axis that extends away from the mount substrate with increase in distance from the front end surface; and
   the front surface of the mount substrate has an inclined structure such that the front-end-surface-side emergent light is directed perpendicularly to the reference surface.

4. The optical semiconductor device according to claim 3, wherein the mount substrate is disposed so that its back surface is perpendicular to the reference surface.

5. The optical semiconductor device according to claim 2, further comprising a body part having a reference surface, wherein the photodiode is disposed on the reference surface;
   the front surface of the mount substrate is perpendicular to the reference surface; and
   the front-end-surface-side emergent light is emitted while having an emergence optical axis perpendicular to the reference surface.

6. The optical semiconductor device according to claim 3, wherein the semiconductor laser has an active layer, and
   wherein the angle formed between the emergence optical axis of the front-end-surface-side emergent light and the active layer and the angle formed between the emergence optical axis of the rear-end-surface-side emergent light and the active layer are different from each other.

7. The optical semiconductor device according to claim 3, further comprising a lead pin fixed on the body part,
   wherein the lead pin has a bent structure such that its end portion projecting from the reference surface has surface contact with the front surface of the mount substrate.

8. The optical semiconductor device according to claim 3, further comprising a lead pin fixed on the body part,
   wherein the lead pin has a structure in which its end portion is bent so that an upper surface of the end portion projecting from the reference surface has surface contact with a side surface of the mount substrate opposed to the reference surface.

9. The optical semiconductor device according to claim 3, further comprising a lead pin fixed on the body part,
   wherein the mount substrate has a cut hollowed in conformity to an end portion of the lead pin projecting from the reference surface, and
   wherein the end portion of the lead pin is disposed in the cut.

10. The optical semiconductor device according to claim 7, further comprising pattern wiring connecting the semiconductor laser and the lead pin to each other.

11. The optical semiconductor device according to claim 1, wherein the semiconductor laser has:
    a laser part having a semiconductor substrate and an active layer; and
    an optical waveguide part in which a refractive index of an upper semiconductor layer positioned higher than the active layer is larger than a refractive index of a lower semiconductor layer positioned lower than the active layer, and
    wherein the optical waveguide part is disposed adjacent to the rear end surface in emergence surfaces of the laser part at the opposite ends.

12. The optical semiconductor device according to claim 11, wherein the optical waveguide part is provided adjacent to the front end surface.

13. The optical semiconductor device according to claim 11, wherein the optical waveguide part has at a position adjacent to the active layer a core layer having a refractive index equal to or smaller than a refractive index of the active layer.

14. The optical semiconductor device according to claim 13, wherein the upper semiconductor layer includes:
   a first light distribution modification layer having a refractive index larger than that of the semiconductor substrate; and
   a first semiconductor layer disposed between the core layer and the first light distribution modification layer and having a refractive index smaller than those of the core layer and the first light distribution modification layer.

15. The optical semiconductor device according to claim 14, wherein the first light distribution modification layer has such a structure that the refractive index changes stepwise.

16. The optical semiconductor device according to claim 14, wherein the first light distribution modification layer has such a structure that the refractive index changes continuously.

17. The optical semiconductor device according to claim 14, wherein the laser part has:
   the semiconductor substrate formed of InP of a first type, which is one of an N type and a P type;
   a first cladding layer disposed on a surface of the semiconductor substrate and formed of InP of the first type;
   the active layer disposed on a surface of the first cladding layer and formed of AlGaInAs compound having a refractive index larger than that of InP; and
   a second cladding layer disposed on a surface of the active layer and formed of InP of a second type, which is the other of the N type and the P type,
   wherein the first light distribution modification layer is formed of an InGaAsP compound having a refractive index larger than that of InP.

18. The optical semiconductor device according to claim 14, wherein the lower semiconductor layer includes a second light distribution modification layer having a refractive index smaller than that of the semiconductor substrate.

19. The optical semiconductor device according to claim 18, wherein the second light distribution modification layer has such a structure that the refractive index changes stepwise.

20. The optical semiconductor device according to claim 18, wherein the second light distribution modification layer has such a structure that the refractive index changes continuously.

21. The optical semiconductor device according to claim 18, wherein the second light distribution modification layer is formed of an InGaAsP compound having a refractive index smaller than that of InP.

22. The optical semiconductor device according to claim 11, wherein the semiconductor laser has an electrode provided on at least one of its front surface and back surface, the electrode covering the laser part while leaving the optical waveguide part exposed.

* * * * *